United States Patent
Kumazawa et al.

(10) Patent No.: US 7,910,406 B2
(45) Date of Patent: Mar. 22, 2011

(54) ELECTRONIC CIRCUIT DEVICE AND METHOD FOR MANUFACTURING SAME

(75) Inventors: Kentaro Kumazawa, Osaka (JP); Shigeru Kondou, Osaka (JP); Hidenobu Nishikawa, Nara (JP)

(73) Assignee: Panasonic Corporation, Osaka (JP)

( * ) Notice: Subject to any disclaimer, the term of this patent is extended or adjusted under 35 U.S.C. 154(b) by 310 days.

(21) Appl. No.: 12/066,534

(22) PCT Filed: Oct. 19, 2006

(86) PCT No.: PCT/JP2006/320823
§ 371 (c)(1),
(2), (4) Date: Mar. 12, 2008

(87) PCT Pub. No.: WO2007/052476
PCT Pub. Date: May 10, 2007

(65) Prior Publication Data
US 2009/0267214 A1   Oct. 29, 2009

(30) Foreign Application Priority Data

Nov. 2, 2005  (JP) .................................. 2005-319043

(51) Int. Cl.
*H01L 21/00*   (2006.01)
(52) U.S. Cl. ........................ 438/127; 438/126
(58) Field of Classification Search .................. 257/787, 257/784, 723, 724; 438/126, 127, 124, 112
See application file for complete search history.

(56) References Cited

U.S. PATENT DOCUMENTS

| 6,861,288 B2 * | 3/2005 | Shim et al. ..................... 438/109 |
| 7,521,297 B2 * | 4/2009 | Lee et al. ...................... 438/127 |
| 2005/0168960 A1 | 8/2005 | Asahi et al. |

FOREIGN PATENT DOCUMENTS

| JP | 5-114693 | 5/1993 |
| JP | 7-321139 | 12/1995 |
| JP | 2001-077268 | 3/2001 |
| JP | 2001-217338 | 8/2001 |
| JP | 2001-345415 | 12/2001 |
| JP | 2005-244211 | 9/2005 |
| JP | 2005-294443 | 10/2005 |

OTHER PUBLICATIONS

International Search Report issued Dec. 19, 2006 in the International (PCT) Application of which the present application is the U.S. National Stage.
Partial English translation of JP 2005-294443A, Oct. 2005, which was cited in the IDS filed Mar. 12, 2008.
Partial English translation of JP5-114693A, May 1993, which was cited in the IDS filed Mar. 12, 2008.

* cited by examiner

*Primary Examiner* — S. V Clark
(74) *Attorney, Agent, or Firm* — Wenderoth, Lind & Ponack, L.L.P.

(57) ABSTRACT

An electronic circuit device includes at least one semiconductor element, a plurality of external connection terminals, connecting conductors electrically connecting the semiconductor element and external connection terminals, and an insulating resin covering the semiconductor element and supporting the connecting conductors integrally. The semiconductor element is buried in the insulating resin, and terminal surfaces of the external connection terminals are exposed from the insulating resin.

6 Claims, 10 Drawing Sheets

ELECTRONIC CIRCUIT DEVICE AND METHOD FOR MANUFACTURING SAME

This application is a U.S. national phase application of PCT International Application PCT/2006/320823, filed Oct. 19, 2006.

TECHNICAL FIELD

The present invention relates to an electronic circuit device formed of a semiconductor element or a composite component of a semiconductor element and a passive component, and more particularly to an electronic circuit device constituted without using a wiring substrate, and a method of manufacturing the same.

BACKGROUND ART

Recently, in an IC card, a cell phone, and a portable terminal device or the like, there is an increasing demand for a thinner, smaller, and lighter structure of an electronic circuit device formed of a semiconductor element or a composite of a semiconductor element and an electronic component. To realize such small and thin design, in particular, an electronic circuit device without using a die pad or a wiring substrate is proposed.

FIG. 10 is a sectional view of a conventional electronic circuit device that does not use a support substrate such as a wiring substrate disclosed in Unexamined Japanese Patent Publication No. 2001-217338. In this electronic circuit device, a conductive path 50, a semiconductor element 51, and a chip type electronic component 54 are buried in an insulating resin 56. The semiconductor element 51 is fixed to a conductive path 50B of the conductive path 50 by means of a conductive paste 52 such as silver paste. Electrode pads (not shown) of the semiconductor element 51 are connected to conductive paths 50A, 50C of the conductive path 50 by means of a thin metal wire 53. Electrodes of the chip type electronic component 54 are connected to conductive paths 50C, 50D of the conductive path 50 by using a brazing material 55. A part of the conductive path 50 in a thickness direction is buried in the insulating resin 56, and the other side is exposed from the insulating resin 56.

The insulating resin 56 is, for example, a thermosetting resin such as epoxy resin, or a thermoplastic resin such as polyimide resin, and is processed into a shape as shown in the drawing by mold forming by using a die. The conductive path 50 is a conductive film mainly made of copper or aluminum, or an alloy foil of iron-nickel or the like.

This electronic circuit device is manufactured in the following process. First, in a thickness direction of conductive foil, division grooves are formed to a depth greater than the thickness of the shape finally becoming conductive films 50A, 50B, 50C, 50D individually. Next, in a region to become conductive path 50B, a semiconductor element 51 is die-bonded, and regions to become conductive paths 50A, 50C and electrode pads are connected by a metal thin wire 53. A chip type electronic component 54 is mounted by soldering or the like in regions to become conductive paths 50C, 50D. Later, the parts are molded by an insulating resin 56. Further, the conductive paths are polished and division grooves are exposed, so that an electronic circuit device having mutually separate conductive paths 50A, 50B, 50C, 50D is obtained.

Further, an electronic circuit device intended to not only become thin but also prevent cracks of the package in solder reflow is disclosed in Unexamined Japanese Patent Publication No. H7-321139.

FIG. 11 is a sectional view of this electronic circuit device. In this electronic circuit device, electrode pads (not shown) of a semiconductor element 61 and leads 62 are connected by a bonding wire 63 of thin metal wire, and the parts are molded by an insulating resin 64 except for parts of leads 62. Since the leads 62 and semiconductor element 61 are supported by the insulating resin 64, a support substrate is not needed, and as compared with the conventional electronic circuit device using a lead frame, not only is the thickness reduced, but also cracks are less likely to occur even when heat is applied in solder reflow.

This electronic circuit device is manufactured in the following process. First, a support stand having a recess for fixing the semiconductor element 61 is prepared. Next, in the recess of the support stand, the semiconductor element 61 and a lead frame are disposed. A die pad is not provided at the lead frame, and only leads 62 are provided. The semiconductor element 61 is temporarily fixed to the support stand by vacuum attraction. Electrode pads (not shown) of semiconductor element 61 and leads 62 are connected by a bonding wire 63. In this state, the semiconductor element 61 held by the lead frame and bonding wire 63 is dismounted from the support stand, and is placed in a molding die, and is molded with resin. After that, from the molded structure, the lead frame is cut off, and the leading ends of the leads 62 are folded outward, so that the electronic circuit device shown in FIG. 11 is obtained.

According to the electronic circuit device explained in JP 2001-217338, since the conductive paths are supported by the insulating resin, the support substrate is not needed in the final state. Therefore, as compared with the conventional electronic circuit device using the lead frame, a thinner electronic circuit device is realized. However, since the semiconductor element is fixed to the surface of conductive paths by solder or the like, strain due to a difference in coefficient of thermal expansion occurs, and expansion or cracks may be caused. Besides, to realize an electronic circuit device, it is required to polish the conductive foil until division grooves are exposed, and this step is relatively complicated, which makes it hard to reduce the cost.

In the electronic circuit device explained in JP H7-321139, the semiconductor element is not bonded to a die pad, but is buried in the insulating resin. Therefore, if the electronic circuit device is exposed to heat when it is mounted on the circuit board, cracks can be prevented.

In this electronic circuit device, however, since the leads are exposed from the side of the insulating resin used as molding resin, and the external connection terminals are folded in structure, the mounting surface area of the circuit board cannot be decreased. In this method, meanwhile, nothing is taught about the mounting structure of the plurality of semiconductor elements, a composite component of the semiconductor element, a passive component or the like.

SUMMARY OF THE INVENTION

The electronic circuit device of the present invention includes at least one semiconductor element, a plurality of external connection terminals, connecting conductors for electrically connecting the semiconductor element and external connection terminals, and an insulating resin for covering the semiconductor element and supporting the connecting conductors integrally, in which the semiconductor element is buried in the insulating resin, and the terminal surfaces of the external connection terminals are exposed from the insulating resin.

By such configuration, the semiconductor element is held only by the connecting conductors, and is buried substantially in the central region of the insulating resin, so that warping may be substantially decreased.

The manufacturing method of the electronic circuit device of the present invention includes:
- setting a positioning plate having an element accommodating region for accommodating a semiconductor element, and a terminal accommodating region formed in a deeper step than the element accommodating region, for accommodating a plurality of external connection terminals,
- arranging the semiconductor element in the element accommodating region in a direction for exposing the electrode pads of the semiconductor element, and arranging the external connection terminals in the terminal accommodating region,
- connecting the semiconductor element and external connection terminals electrically by connecting conductors,
- a first resin molding step of covering and molding the connecting conductors, semiconductor element and an exposed side of external connection terminals, with an insulating resin, and
- a second resin molding step of covering and molding the region of the external connection terminals contacting with the terminal accommodating region except for its terminal surface and the region excluding a surface of the semiconductor element contacting with the element accommodating region, with an insulating resin, burying the semiconductor element in the insulating resin, integrating the semiconductor element and the external connection terminals, and exposing the terminal surfaces.

By such method, the semiconductor element is buried substantially in the central region of the insulating resin, and the terminal surfaces of external connection terminals exposed. As a result, warping may be substantially suppressed.

DETAILED DESCRIPTION OF THE PREFERRED EMBODIMENTS

Figure 1A:
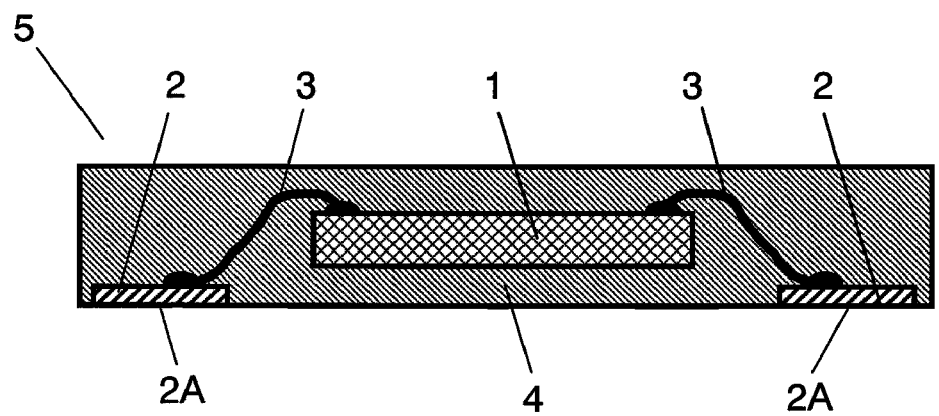
FIG. 1A is a sectional view of an electronic circuit device in a first preferred embodiment of the present invention, along line 1A-1A in FIG. 1B.

Preferred embodiments of the present invention are specifically described below while referring to the accompanying drawings. The same elements are identified with the same reference numerals, and duplicated explanations may be omitted.

First Preferred Embodiment

Figure 1B:
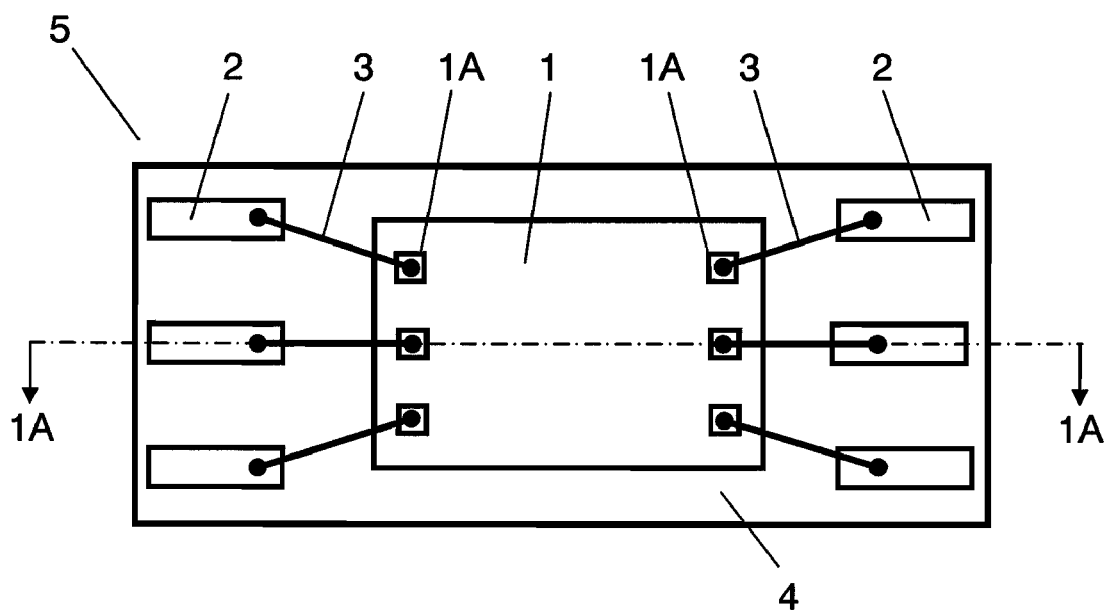
FIG. 1B is a plan view from the top of the electronic circuit device in the first preferred embodiment of the present invention.

FIG. 1A is a sectional view of an electronic circuit device 5 in a first preferred embodiment of the present invention, along line 1A-1A in FIG. 1B, and FIG. 1B is a plan view from the top of an electronic circuit device 5 in the first preferred embodiment of the present invention. For ease of understanding, FIG. 1B is a plan view seen through an insulating resin.

The electronic circuit device 5 shown in FIG. 1A and FIG. 1B includes at least one semiconductor element 1, a plurality of external connection terminals 2, connecting conductors 3 for electrically connecting the semiconductor element 1 and external connection terminals 2, and an insulating resin 4 for covering the semiconductor element 1 and supporting the connecting conductors 3 integrally, in which the semiconductor element 1 is buried in the insulating resin 4, and the terminal surface 2A of the external connection terminals 2 is exposed from the insulating resin 4.

That is, in the electronic circuit device 5 of the preferred embodiment, the semiconductor element 1 is buried in the insulating resin 4, and the external connection terminals 2 are provided at a deeper position than the semiconductor element 1, and all parts are buried in the insulating resin 4, including the semiconductor element 1, external connection terminals 2, and connected conductors 3, except that the terminal surface 2A thereof is exposed from the insulating resin 4.

The insulating resin 4 is made of, for example, thermosetting resin such as epoxy resin, or thermoplastic resin such as polyimide resin or polyphenylene sulfide. Further, the material of insulating resin 4 may be any resin material not particularly specified as far as it has a low viscosity to be poured into a die when heated, or it has a value close to the coefficient of thermal expansion of semiconductor 1. Not limited to forming by pouring into a die, it may be also formed by a dip method or an application coating method.

The connecting conductors 3 are desired to be connected by a wire bonding method by using thin metal wires mainly made of gold, thin metal wires mainly made of aluminum, or thin metal wires mainly made of copper. The wire bonding method can be a thermal compression connection method, an ultrasonic connection method, or a combined ultrasonic and thermal compression connection method.

A bare chips semiconductor element is used as the semiconductor element 1. Examples of the semiconductor element can include a memory, a logic IC, or a CPU. When a light permeable material is used as insulating resin 4, a light-emitting diode, a semiconductor laser, a photo detector, or other optical device may be used.

By such configuration, a thin type electronic circuit device 5 may be realized. Further, since the terminal surface 2A of the external connection terminals 2 is flush with the insulating resin 4, it can be mounted on the circuit board in a minimum thickness. Since the semiconductor element 1 is surrounded by the insulating resin 4 only, cracks do not occurr when thermal impact of solder reflow or the like is applied, so that reliability is improved substantially.

As shown in FIG. 1A and FIG. 1B, in the electronic circuit device 5 of the preferred embodiment, the semiconductor element 1 is disposed substantially in the center in a thickness direction of the insulating resin 4. As a result, the thermal stress applied to the semiconductor element 1 by the insulating resin 4 is uniformly applied to the surface forming electrode pads 1A and the opposite reverse side, so that warping of the electronic circuit device may be substantially suppressed. However, the present invention is not limited to this example, and is not particularly specified as long as the semiconductor element 1 is covered with the insulating resin 4 and is buried.

In FIG. 1B, the electrode pads 1A of the semiconductor element 1 are disposed at both ends in the longitudinal direction, but the electrode pads 1A may also be disposed at four sides of the semiconductor element 1. In this case, the external connection terminals 2 may also be disposed at positions corresponding to the electrode pads 1A of the semiconductor element 1.

The manufacturing method of the electronic circuit device 5 of the preferred embodiment is explained below by referring to FIG. 2A to FIG. 2C and FIG. 3A to FIG. 3C.

Figure 2A:
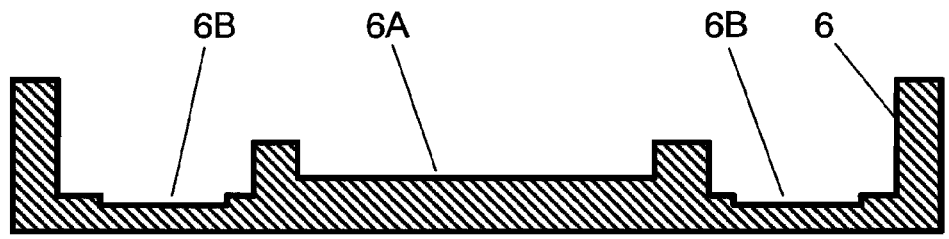
FIG. 2A is a sectional view explaining steps in the first half of a manufacturing method of the electronic circuit device in the first preferred embodiment of the present invention.
Figure 2B:
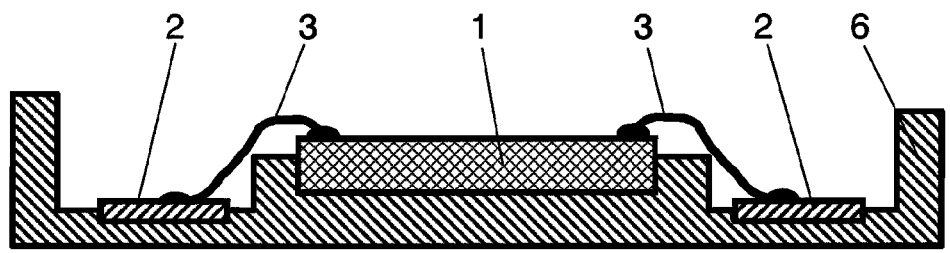
FIG. 2B is a sectional view explaining steps in the first half of the manufacturing method of the electronic circuit device in the first preferred embodiment of the present invention.
Figure 2C:
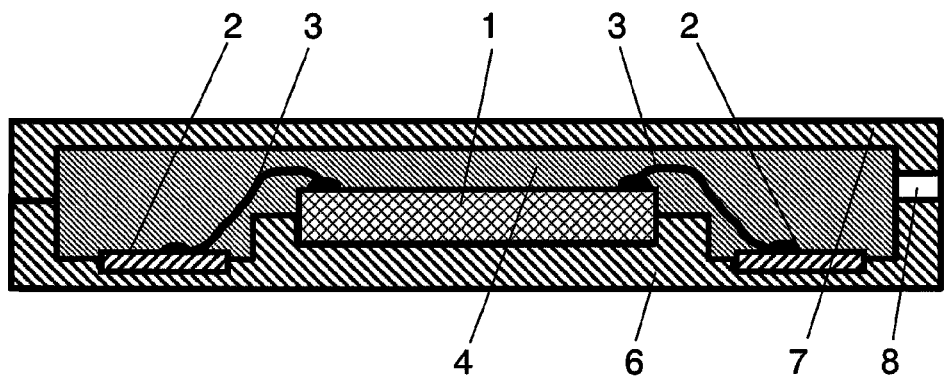
FIG. 2C is a sectional view explaining steps in the first half of the manufacturing method of the electronic circuit device in the first preferred embodiment of the present invention.
Figure 3A:
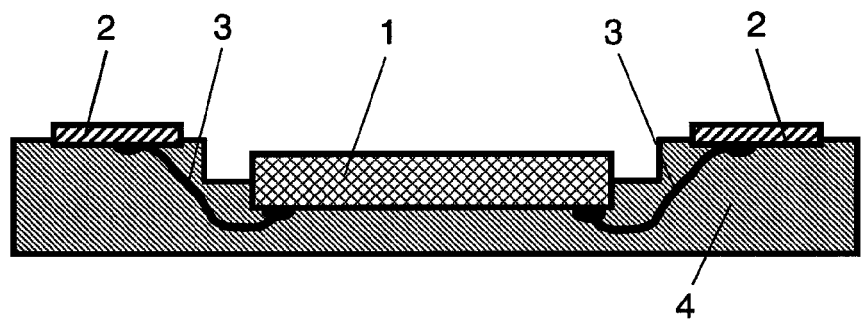
FIG. 3A is a sectional view explaining steps in the second half of the manufacturing method of the electronic circuit device in the first preferred embodiment of the present invention.
Figure 3B:
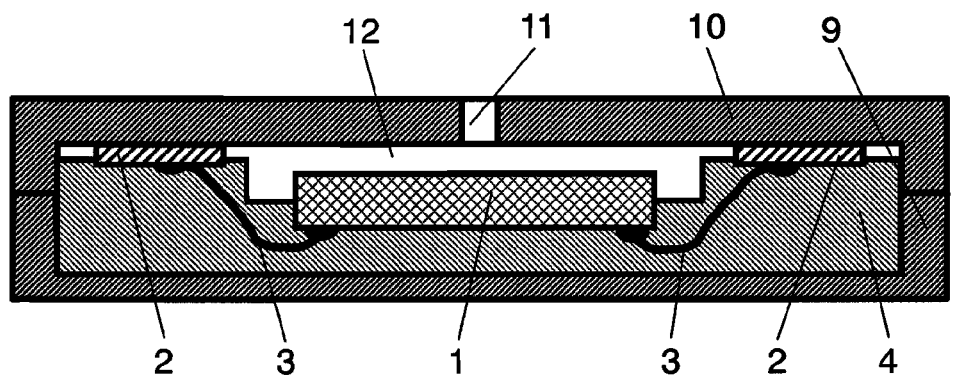
FIG. 3B is a sectional view explaining steps in the second half of the manufacturing method of the electronic circuit device in the first preferred embodiment of the present invention.
Figure 3C:
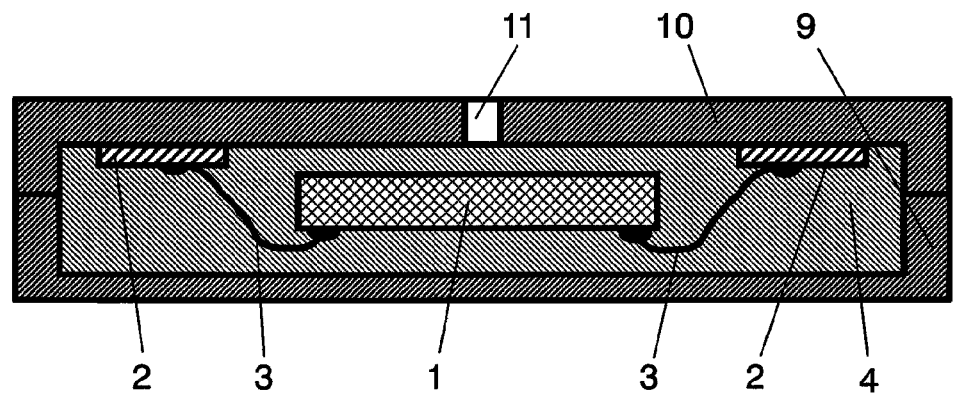
FIG. 3C is a sectional view explaining steps in the second half of the manufacturing method of the electronic circuit device in the first preferred embodiment of the present invention.

FIG. 2A to FIG. 2C are sectional views explaining steps in the first half of the manufacturing method of the electronic circuit device 5 in the preferred embodiment. FIG. 3A to FIG. 3C are sectional views explaining steps in the second half of the manufacturing method of the electronic circuit device 5.

First, as shown in FIG. 2A, a positioning plate 6 is prepared. This positioning plate 6 is made of a material resistant to heat, hardly deformed by heat, and smooth in parting property to resin, such as tungsten alloy, or other metal material, other ceramics such as alumina, engineering plastics, or their composite material.

The positioning plate 6 has an element accommodating region 6A for accommodating the semiconductor element 1 and a terminal accommodating region 6B for accommodating external connection terminals 2. The terminal accommodating region 6B is formed at a proper interval at both ends in longitudinal direction of element accommodating region 6A. These regions are formed at a deep step so that the depth of terminal accommodating region 6B may be greater than the depth of element accommodating region 6A. Such depth is determined in such relation that the semiconductor element 1 may be disposed substantially in the center of the insulating resin 4 when the insulating resin 4 is formed. The element accommodating region 6A and terminal accommodating region 6B may be processed at high precision by cutting or discharge processing, for example, when a metal material is used as positioning plate 6.

Further, as shown in FIG. 2B, the semiconductor element 1 is disposed in the element accommodating region 6A, and the external connection terminals 2 are disposed in the terminal accommodating regions 6B. At this time, the semiconductor element 1 is disposed in a direction so that its electrode pads (not shown) may be exposed. Preferably, the semiconductor element 1 and external connection terminals 2 are fixed respectively in the element accommodating region 6A and terminal accommodating regions 6B. For this purpose, for example, an adhesive may be applied. As the adhesive, preferably, a material losing its adhesiveness when it is heated to a specific temperature may be used. Thus, the adhesiveness can be lost in heating when insulating resin 4 is injected. As a result, the semiconductor element 1 and external connection terminals 2 can be easily peeled off from the positioning plate 6 after the insulating resin is cooled. Alternately, by forming a through-hole in part of the region forming the element accommodating region 6A and terminal accommodating region 6B of the positioning plate 6, vacuum contact may be performed by way of this through-hole.

Later, the semiconductor element 1 and external connection terminals 2 are connected by thin metal wires as connecting conductors 3 by, for example, a wire bonding method.

Consequently, as shown in FIG. 2C, a molding die 7 for resin molding and the positioning plate 6 are fitted. In the manufacturing method of the preferred embodiment, the positioning plate 6 is used as part of the die for resin molding.

Thus, by utilizing the positioning plate 6 as part of the die for molding, resin molding is enabled with the semiconductor element 1 and external connection terminals 2 fixed.

After fitting the molding die 7 and positioning plate 6, an insulating resin material of low viscosity is poured through a resin flow inlet 8. After pouring, the insulating resin material is cured.

Next, as shown in FIG. 3A, the structure of which one side is molded with resin is taken out. In this state, the semiconductor element 1, part of external connection terminals 2, and all of the connecting conductors 3 are buried in the insulating resin 4, and fixed by the insulating resin 4. Therefore, if it is taken out, the relative positions are not changed, and the connected parts are not separated.

As shown in FIG. 3B, the structure of which one side is molded with resin is disposed in a lower die 9 so that the resin molded side is down. An upper die 10 is fitted thereon. As a result, a space 12 is formed. An insulating resin material of low viscosity is poured into the space 12 from a resin flow inlet 11. Then, the poured insulating resin material is cured. The insulating resin material to be cured is preferably the same material as the insulating resin material used in the step illustrated in FIG. 2C. As a result, after cooling, the semiconductor element 1, the connecting conductors 3, and part of the external connection terminals 2 are sealed with one type of insulating resin material, so that an electronic circuit device 5 shown in FIG. 1A is obtained by removing the lower die 9 and upper die 10.

In the manufacturing method of the electronic circuit device 5 of the preferred embodiment, the insulating resin 4 is poured using a transfer mold; however, the present invention can be not limited to this method. For example, the resin molding is realized by injection mold or dipping. As the resin material, when thermosetting resin such as epoxy resin is used, the transfer molding method is preferred, or when thermoplastic resin such as polyimide resin or polyphenylene sulfide is used, the injection molding method is preferred. This is the same in other preferred embodiments described below.

In this preferred embodiment, the manufacturing method for manufacturing the electronic circuit device by using one semiconductor element 1 is explained; however, the present invention is not limited to this example. The electronic circuit device may be manufactured using a plurality of semiconductor elements, or using a semiconductor element and a passive component in the same manner.

Figure 4A:
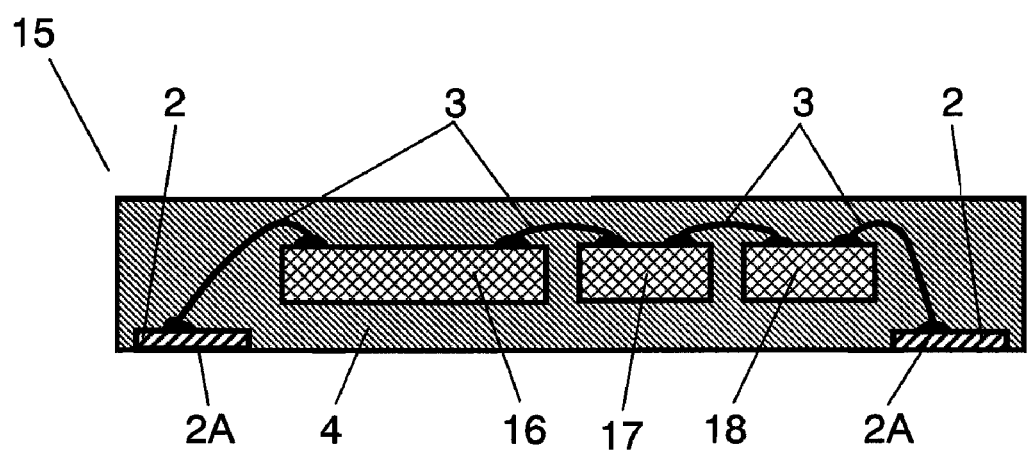
FIG. 4A is a sectional view of a second example of the electronic circuit device in the first preferred embodiment of the present invention, along line 4A-4A in FIG. 4B.
Figure 4B:
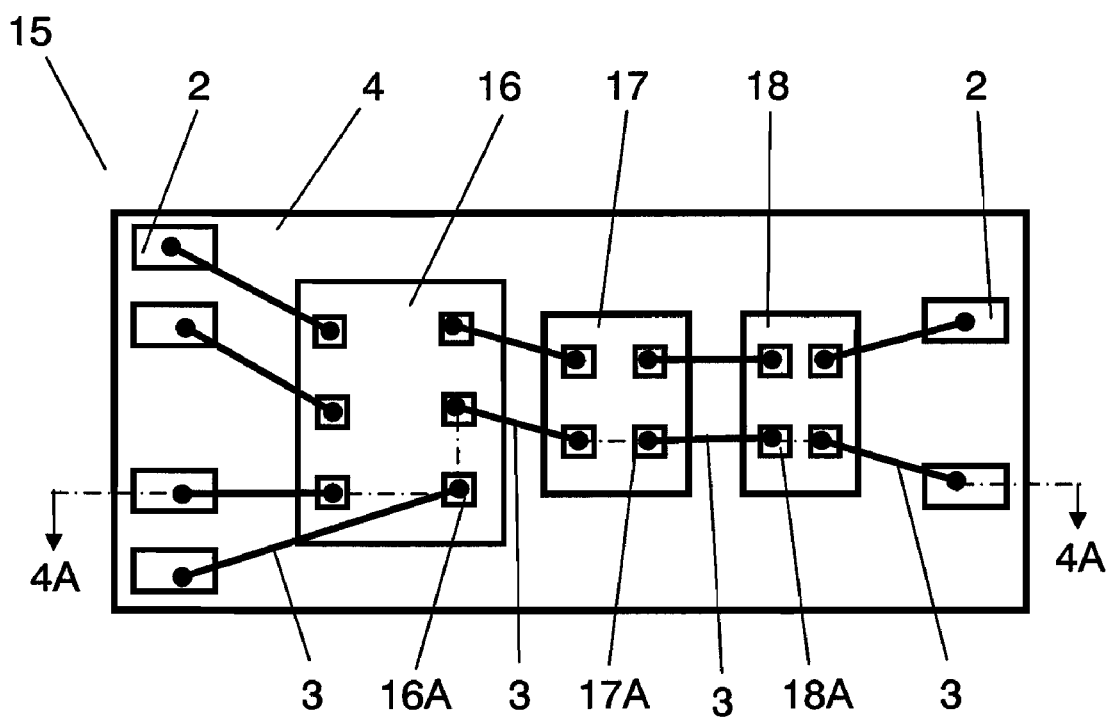
FIG. 4B is a plan view from the top of the second example of electronic circuit device in the first preferred embodiment of the present invention.

FIG. 4A is a sectional view of a second example of the electronic circuit device in the first preferred embodiment of the present invention, along line 4A-4A in FIG. 4B, and FIG. 4B is a plan view from the top of the second example of the electronic circuit device in the first preferred embodiment of the present invention. For ease of understanding, FIG. 4B is a plan view seen through an insulating resin.

The electronic circuit device 15 in the second example differs from the electronic circuit device 5 of the preferred embodiment in that the electronic circuit device 15 in the second example has a plurality of semiconductor elements 16, 17, 18 disposed substantially on the same plane, and electrode pads 16A, 17A, 18A are mutually connected, including the external connection terminals 2, by means of thin metal wires 3.

By this configuration, an electronic circuit device that is thin and has high functionality is realized. The electronic circuit device 15 in the second example may be manufactured in the same steps as in the manufacturing method of the electronic circuit device 5 of the preferred embodiment, and further explanation is omitted.

In FIG. 4A and FIG. 4B, the semiconductor elements 16, 17, 18 are almost the same in thickness, and disposed in a row on the same plane, but the thickness may be different, or they may not be formed in one row. In the electronic circuit device 15 in the second example, three semiconductor elements 16, 17, 18 are used; however, the present invention is not limited to this example. For example, a semiconductor element and a passive component may be combined. As the passive component, for example, a chip resistor, a capacitor, an inductor, or a sensor may be used.

In the electronic circuit device 15 shown in FIG. 4A and FIG. 4B, one thin metal wire 3 is connected to each of electrode pads 16A, 17A, 18A of semiconductor elements 16, 17, 18; however, a plurality of thin metal wires 3 may be connected. Similarly, a plurality of thin metal wires 3 may be connected to one external connection terminal 2.

Figure 5A:
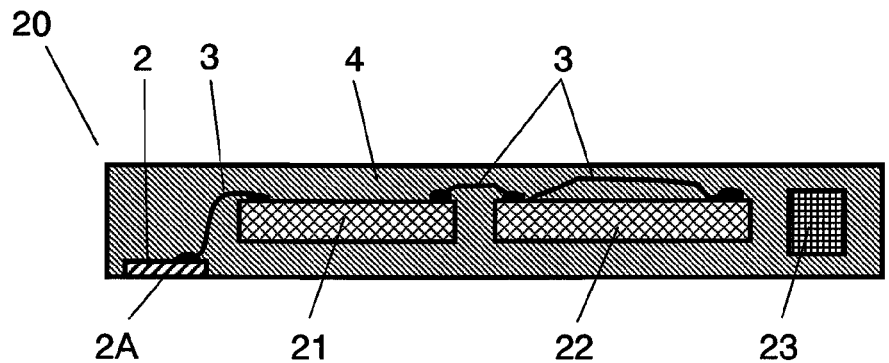
FIG. 5A is a sectional view of a third example of the electronic circuit device in the first preferred embodiment of the present invention, along line 5A-5A in FIG. 5B.
Figure 5B:
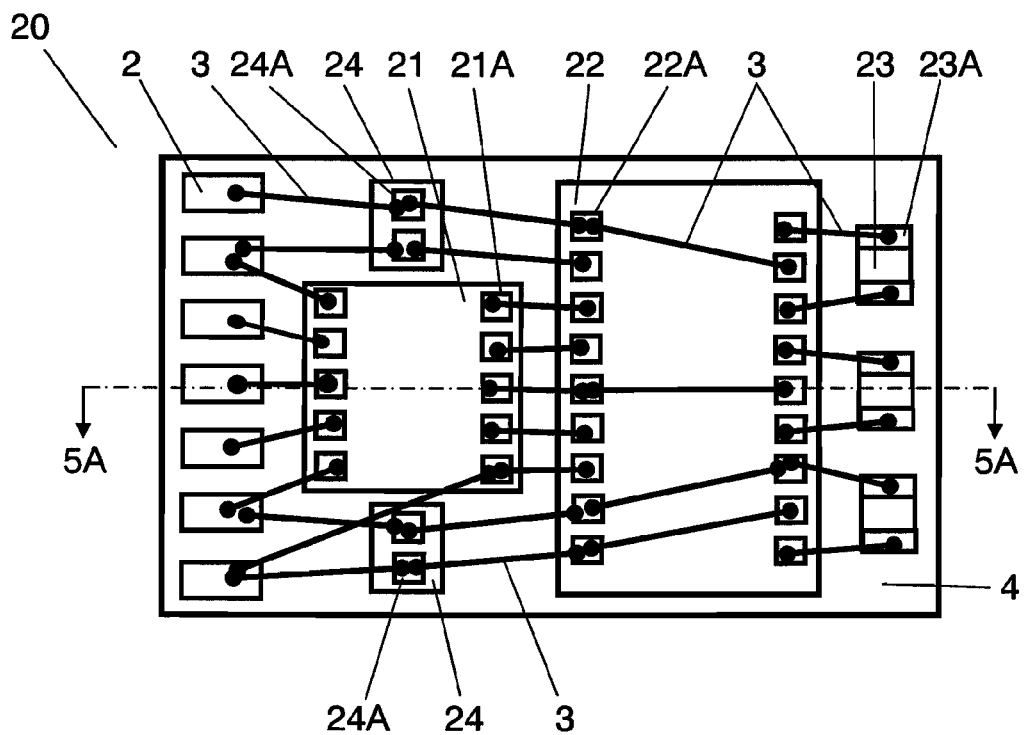
FIG. 5B is a plan view from the top of the third example of the electronic circuit device in the first preferred embodiment of the present invention.

FIG. 5A is a sectional view of a third example of the electronic circuit device in the first preferred embodiment of the present invention, along line 5A-5A in FIG. 5B, and FIG. 5B is a plan view from the top of the third example of the electronic circuit device in the first preferred embodiment of the present invention. For ease of understanding, FIG. 5B is a plan view seen through an insulating resin.

In the electronic circuit device 20 of the third example, an electronic circuit is formed of semiconductor elements 21, 22 and a passive component 23. In the electronic circuit device 20 of the third example, relay terminal plates 24 are disposed at both sides of semiconductor element 21. The thickness of each relay terminal plate 24 is desired to be substantially the same as that of semiconductor elements 21, 22. The semiconductor elements 21, 22, the passive component 23 and the relay terminal plates 24 are provided with a necessary number of electrode pads 21A, 22A, 23A, 24A. By using the relay terminal plate 24, if the connecting distance is relatively long, for example, between the electrode pad 22A of the semiconductor element 22 and the external connection terminal 2, a stable connection is realized by preventing shorting or other defects by the metal thin wire used as connecting conductor 3.

As shown in FIG. 5B, the electrode pads 21A, 22A of semiconductor elements 21, 22, the electrode pads 24A of relay terminal plates 24, and the external connection terminals 2 may be connected by a plurality of thin metal wires 3, so that an electronic circuit board of high function is realized without using a wiring substrate. For example, in the electronic circuit device 20 shown in FIG. 5A and FIG. 5B, when the semiconductor element 21 is an IC for control, and the semiconductor element 22 is a large-capacity memory and the passive component 23 is a chip capacitor, a thin type memory card such as an SD memory card may be manufactured easily. In the manufactured memory card, the semiconductor element is disposed substantially in the central part of the insulating resin. Therefore, if it is molded with insulating resin, warp can be extremely decreased. As a result, even when this card is mounted on various electronic appliances, troubles are not caused by the inserting action of the memory card.

If it is possible to connect by the thin metal wire 3 without using relay terminal plates 24, in particular, the relay terminal plates 24 are not needed. In the electronic circuit device 20 of the third example, the relay terminal plates 24 are disposed on the same plane as the semiconductor elements 21, 22; however they may be disposed on the surface of semiconductor elements 21, 22. As a result, the degree of freedom of connecting by the thin metal wires 3 is increased.

Figure 5C:
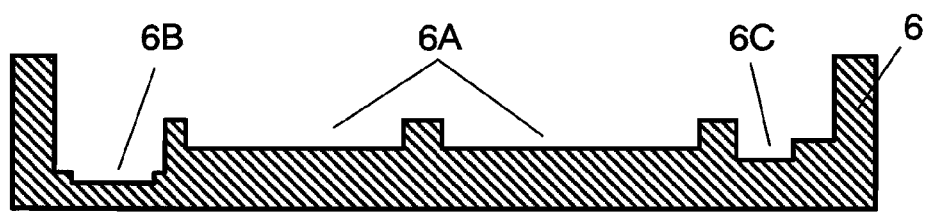
FIG. 5C is a sectional view of a positioning plate used in manufacturing of the third example of the electronic circuit device in the first preferred embodiment of the present invention.

The electronic circuit device 20 in the third example can be manufactured in the same procedure as in previously-discussed examples of the preferred embodiment, so that its further explanation is omitted, except that, as shown in FIG. 5C, the positioning plate 6 having at least a component accommodating region 6C shallower than the terminal accommodating region 6B is used. That is, in the terminal accommodating region 6B of the positioning plate 6 shown in FIG. 5C, the external connection terminals 2 are disposed. In the element accommodating region 6A, the semiconductor elements 21, 22 are disposed. In the component accommodating region 6C, the passive component 23 is disposed. After this process, the electronic circuit device 20 is manufactured in the same manufacturing method as the electronic circuit device 5. This positioning plate may be used in manufacture of the electronic circuit device having a semiconductor element or passive component differing in height (thickness).

Second Preferred Embodiment

Figure 6A:
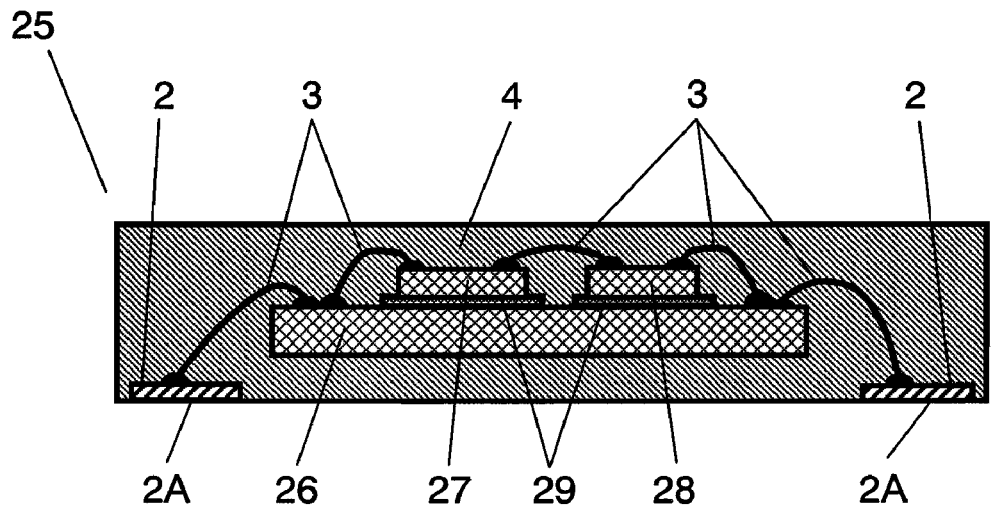
FIG. 6A is a sectional view of an electronic circuit device in a second preferred embodiment of the present invention, along line 6A-6A in FIG. 6B.
Figure 6B:
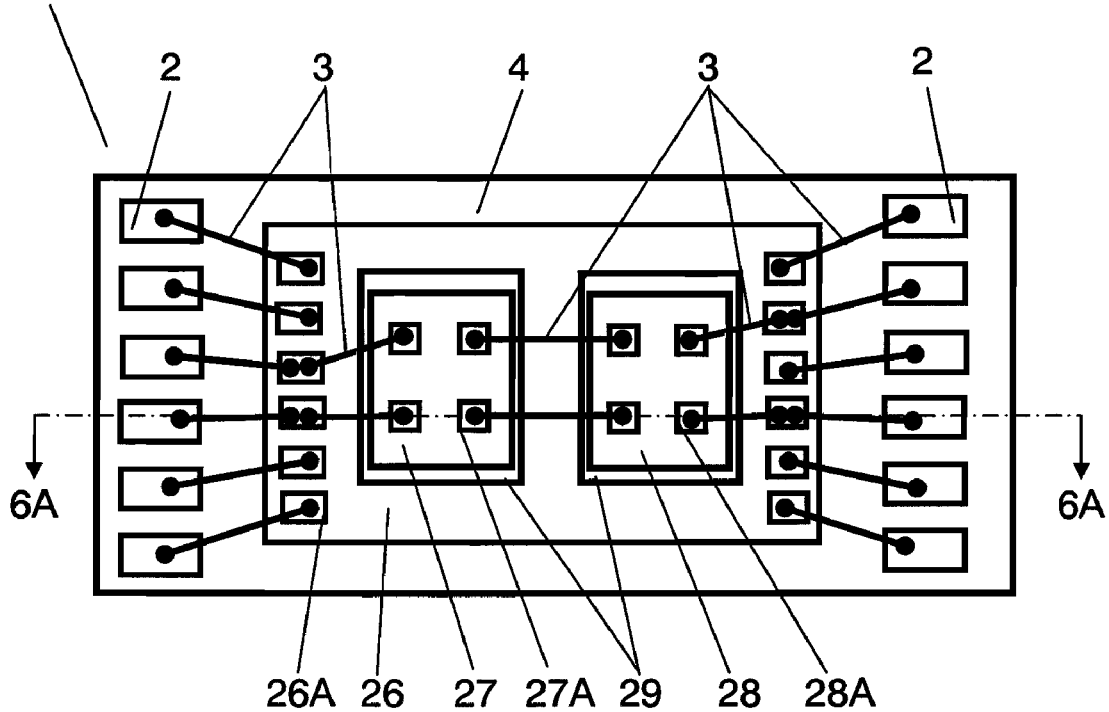
FIG. 6B is a plan view from the top of the electronic circuit device in the second preferred embodiment of the present invention.

FIG. 6A is a sectional view of an electronic circuit device 25 in a second preferred embodiment of the present invention, along line 6A-6A in FIG. 6B, and FIG. 6B is a plan view from the top of the electronic circuit device 25 in the second preferred embodiment of the present invention. For ease of understanding, FIG. 6B is a plan view seen through an insulating resin.

In the electronic circuit device 25 of the preferred embodiment, second semiconductor elements 27, 28 are laminated and disposed on the surface of a first semiconductor element 26. The first semiconductor element is a large semiconductor element, and each of the second semiconductor elements is a smaller semiconductor element than the first semiconductor element. As seen from FIG. 6A and FIG. 6B, the second semiconductor elements 27, 28 are adhered and fixed on the surface of the first semiconductor element 26 by means of an insulating adhesive 29, except for the region of electrode pads. The first semiconductor element 26, the second semiconductor elements 27, 28, and the external connection terminals 2 are mutually connected by connecting conductors 3 which are thin metal wires. Electrode pads 26A, 27A, 28A and the external connection terminals 2 are mutually connected by a plurality of thin metal wires 3 as required. As a result, without using a wiring substrate, the electronic circuit device 25 having a relatively complicated function can be realized.

The manufacturing method of the electronic circuit device 25 of the second preferred embodiment of the present invention is described below while referring to FIG. 7A to FIG. 7D.

FIG. 7A to FIG. 7D are sectional views showing principal steps of the manufacturing method of the electronic circuit device 25 of the preferred embodiment.

Figure 7A:
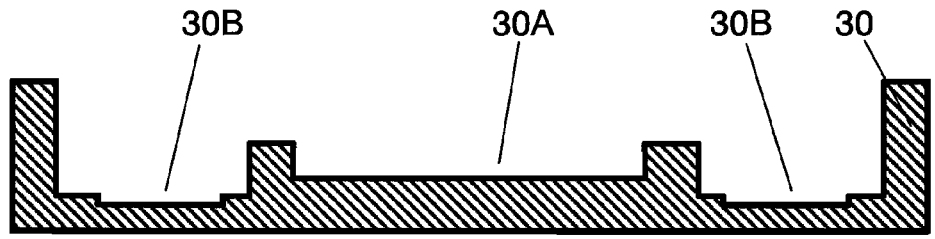
FIG. 7A is a sectional view explaining principal steps of a manufacturing method of the electronic circuit device in the second preferred embodiment of the present invention.

First, a positioning plate 30 is prepared as shown in FIG. 7A. This positioning plate 30 is preferably made of the same material as in the manufacturing method of the first preferred embodiment. The positioning plate 30 is provided with an element accommodating region 30A for accommodating the first semiconductor element 26, and a terminal accommodating region 30B for accommodating the external connection terminal 2. The terminal accommodating region 30B is formed at both ends of the element accommodating region 30A in the longitudinal direction with specific intervals. A deep step is formed so that the depth of the terminal accommodating region 30B is deeper than the depth of the element accommodating region 30A. This depth is determined by the relative positions so that the first semiconductor element 26 may be disposed substantially in the central part of the insulating resin 4 when the insulating resin 4 is formed. The element accommodating region 30A and the terminal accommodating region 30B can be processed at high precision by cutting or discharge machining when the positioning plate 30 is a metal material.

Figure 7B:
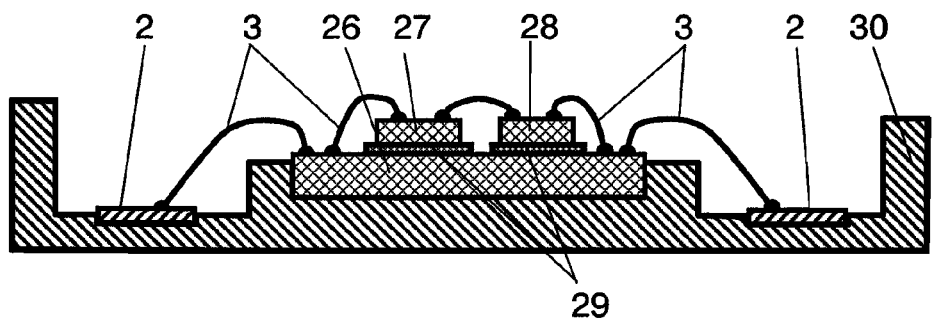
FIG. 7B is a sectional view explaining principal steps of the manufacturing method of the electronic circuit device in the second preferred embodiment of the present invention.

Next, as shown in FIG. 7B, the first semiconductor element 26 is disposed in the element accommodating region 30A, and the external connection terminal 2 is disposed in the terminal accommodating region 30B. At this time, it is disposed so that the electrode pads (not shown) of the first semiconductor element 26 may be in a direction to be exposed. Preferably, the first semiconductor element 26 and the external connection terminal 2 are fixed in the element accommodating region 30A and terminal accommodating region 30B. For this purpose, for example, an adhesive may be applied. As the adhesive, if a material having a characteristic of losing its adhesiveness when it is heated to a specific temperature is used, the adhesiveness can be lost in heating when the insulating resin 4 is poured. As a result, the first semiconductor element 26 and the external connection terminal 2 may be easily separated from the positioning plate 30 after the insulating resin 4 is cooled. A through-hole may be formed in part of the region having the element accommodating region 30A and terminal accommodating region 30B of positioning plate 30, so that they may be attracted by vacuum by way of the through-hole.

In the region of the first semiconductor element 26 excluding the electrode pad 26A, the second semiconductor elements 27, 28 are adhered and fixed. They can be adhered easily by applying an insulating adhesive 29 to the backside of the second semiconductor elements 27, 28, and adhering to the region of the first semiconductor region 26 excluding the electrode pad 26A.

Further, the electrode pads 26A, 27A, 28A of the first semiconductor element 26 and the second semiconductor elements 27, 28, and the external connection terminal 2 are mutually connected by the thin metal wires as the connecting conductors 3 by, for example, a wire bonding method.

Figure 7C:
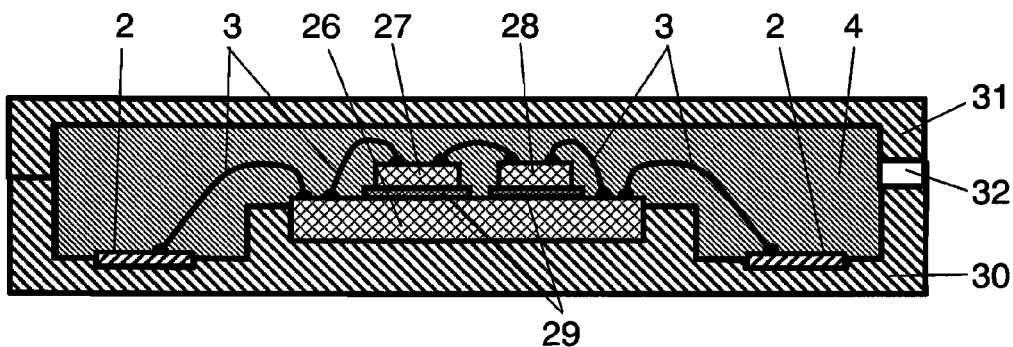
FIG. 7C is a sectional view explaining principal steps of the manufacturing method of the electronic circuit device in the second preferred embodiment of the present invention.

Next, as shown in FIG. 7C, the molding die 31 for resin molding and the positioning plate 30 are fitted. That is, in the manufacturing method of the present embodiment, too, the positioning plate 30 is used as one of dies for resin molding. Thus, when the positioning plate 30 is used as one of dies for resin molding, the first semiconductor element 26 and the second semiconductor elements 27, 28, and the external connection terminal 2 may be directly molded with resin in a fixed state.

After fitting the molding die 31 and positioning plate 30, an insulating resin material of low viscosity is poured from the resin flow inlet 32. The insulating resin material is poured, and then cured.

Figure 7D:
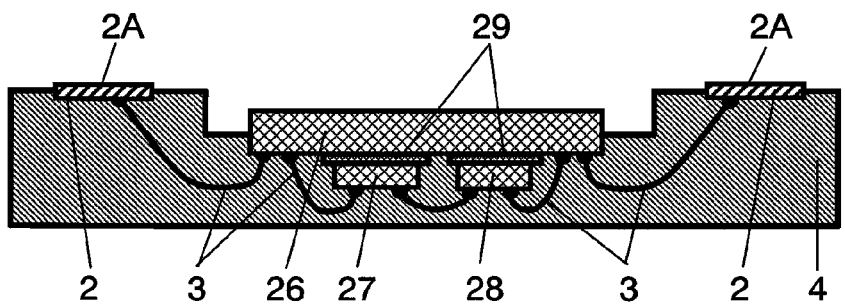
FIG. 7D is a sectional view explaining principal steps of the manufacturing method of the electronic circuit device in the second preferred embodiment of the present invention.

Next, as shown in FIG. 7D, the structure having one side molded with resin is taken out. In this state, all of the first semiconductor element 26 and the second semiconductor elements 27, 28, and part of the external connection terminal 2 and the connecting conductors 3 are buried in the insulating resin 4, and fixed in the insulating resin 4. Therefore, if the structure is taken out, the relative positions are not changed and the connecting parts are not separated. By the steps so far, a similar structure as shown in FIG. 3A as explained in the manufacturing method of the first preferred embodiment can be manufactured.

The subsequent steps are the same as shown in FIG. 3B and FIG. 3C, and the process is explained by referring to the same drawings.

First, as shown in FIG. 3B, the structure having one side molded with resin is disposed on the lower die 9 so that the resin mold side is positioned under. The upper die 10 is fitted thereon. As a result, a space 12 is formed. The insulating resin material heated to be low in viscosity is poured into this space 12 through the resin flow inlet 11. The insulating resin material is poured, and then cured. The insulating resin material to be poured at this time is preferably the same as the insulating resin material as used in the steps illustrated in FIG. 7C. As a result, after cooling, the first semiconductor element 26, the second semiconductor elements 27, 28, the connecting conductor 3, and part of the external connection terminals 2 are sealed with one type of insulating resin material, and a structure is formed. Afterwards, by removing the lower die 9 and the upper die 10, the electronic circuit device 25 shown in FIG. 6A is obtained.

In FIG. 6A and FIG. 6B, two second semiconductor elements 27, 28 are laminated on the first semiconductor element 26; however, a second semiconductor element and a passive component may be laminated on the surface of the first semiconductor element. Alternatively, two or more first semiconductor elements may be disposed, and a second semiconductor element, or a second semiconductor element and a passive component may be laminated thereon. Further, a relay terminal plate may be used as explained in the third example of the first preferred embodiment. Furthermore, a dummy pad may be formed on the semiconductor element.

Third Preferred Embodiment

Figure 8A:
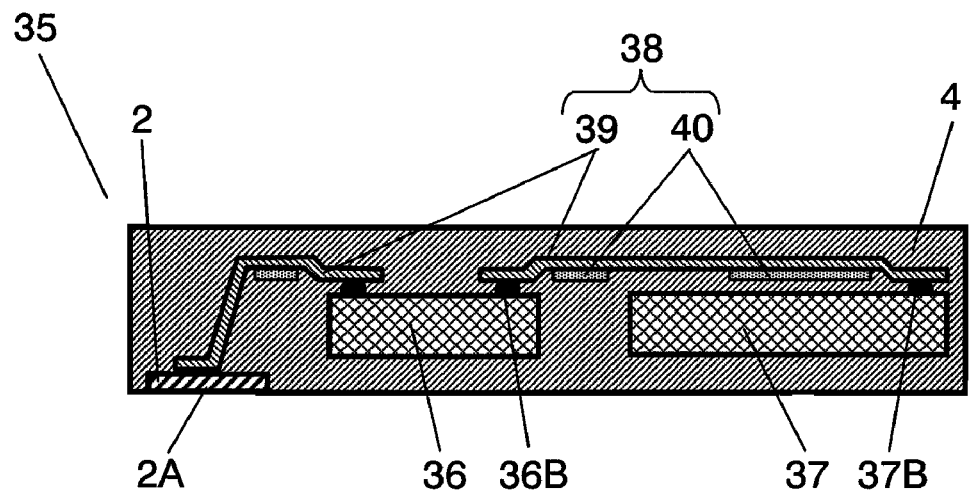
FIG. 8A is a sectional view of electronic circuit device in a third preferred embodiment of the present invention, along line 8A-8A in FIG. 8B.
Figure 8B:
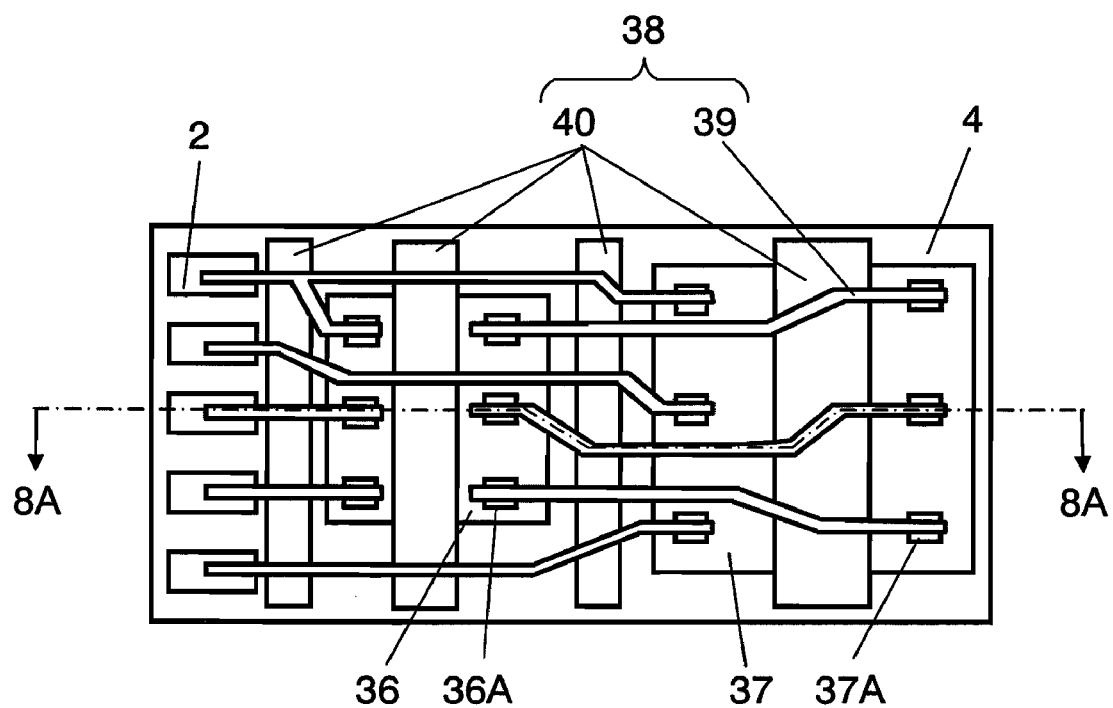
FIG. 8B is a plan view from the top of an electronic circuit device in the third preferred embodiment of the present invention.

FIG. 8A is a sectional view of the electronic circuit device 35 in a third preferred embodiment of the present invention, along line 8A-8A in FIG. 8B, and FIG. 8B is a plan view from the top of the electronic circuit device 35 in the third preferred embodiment of the present invention. For ease of understanding, FIG. 8B is a plan view seen through an insulating resin.

In the electronic circuit device 35 of the preferred embodiment, the connecting conductor is a wiring conductor having its part supported by an insulating sheet. As such a connecting conductor, in the preferred embodiment, a film carrier 38 is used. This film carrier 38 is formed of a wiring conductor 39 made of metal foil supported by an insulating sheet 40. The insulating sheet 40 is usually a polyimide film, and the metal foil is a copper foil in a thickness of 18 μm or 35 μm. By using this film carrier 38 the wiring connection is simple in structure and high in reliability.

In the electronic circuit device 35 of the preferred embodiment, two second semiconductor elements 36, 37 are laminated. This electronic circuit device 35 can be formed as a semiconductor memory card, such as an SD memory card or a micro SD memory card by using a control IC for the semiconductor element 36, and the memory for semiconductor element 37.

Bumps 36B, 37B are formed in electrode pads 36A, 37A of the semiconductor elements 36, 37. The bumps 36B, 37B and the wiring conductor 39 of the film carrier 38 are connected. This connection is generally achieved by thermal compression. For example, when the surface of the wiring conductor 39 of the film carrier 38 is plated with tin, and at least the surface of the bumps 36B, 37B is gold, thermal compression may be achieved easily. The end portion of the wiring conductor 39 of the film carrier 38 is connected to the external connection terminal 2. This connection is also achieved by thermal compression.

In the electronic circuit device 35 of the preferred embodiment having such a configuration, not only can a plurality of semiconductor elements be buried in the insulating resin 4, but also a passive component be connected to form a composite structure.

The manufacturing method of the electronic circuit device 35 of the third preferred embodiment of the present invention is described below while referring to FIG. 9A to FIG. 9D.

FIG. 9A to FIG. 9D are sectional views showing principal steps of the manufacturing method of the electronic circuit device 35 of the preferred embodiment.

Figure 9A:
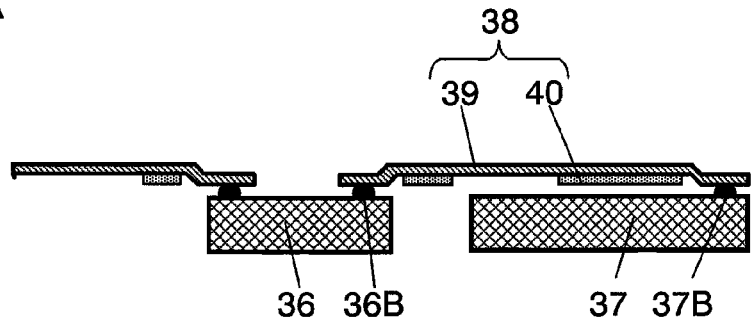
FIG. 9A is a sectional view explaining principal steps of a manufacturing method of the electronic circuit device in the third preferred embodiment of the present invention.

First, as shown in FIG. 9A, as film carrier 38, a wiring conductor 39 corresponding to semiconductor elements 36, 37, and having a pattern shape to be connected to the external connection terminal 2 is formed. An insulating sheet 40 is provided only at a region for holding the wiring conductor 39. Such shape can be formed by processing continuously in a roll state. The semiconductor elements 36, 37 are connected to the film carrier 38 and the wiring conductor 39 respectively. This connection is achieved easily by a thermal compression method when the materials of bumps 36B, 37B and wiring conductor 39 are combined as stated above.

The semiconductor elements 36, 37 can be connected to the film carrier 38 in continuous steps by connecting continuously in the roll state, and then cutting into the shape as shown in FIG. 9A. The wiring conductor 39 may be formed in a free shape by etching copper foil. Therefore, a branched shape as shown in FIG. 8B can be formed easily.

Figure 9B:
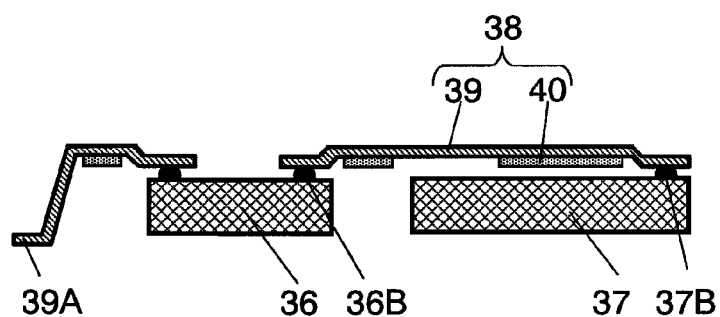
FIG. 9B is a sectional view explaining principal steps of the manufacturing method of the electronic circuit device in the third preferred embodiment of the present invention.

Next, as shown in FIG. 9B, a part of wiring conductor 39 of the film carrier 38 to be connected to the external connection terminal 2 is formed and folded, and its leading end is used as a connection region 39A to the external connection terminal 2.

Figure 9C:
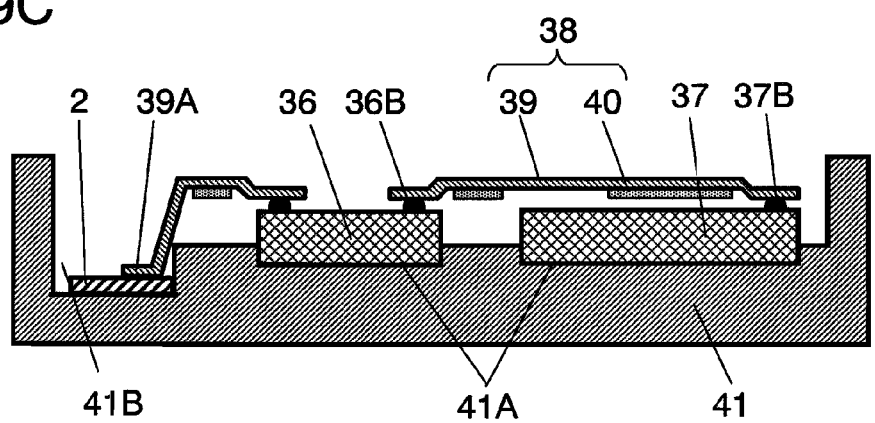
FIG. 9C is a sectional view explaining principal steps of the manufacturing method of the electronic circuit device in the third preferred embodiment of the present invention.

As shown in FIG. 9C, the external connection terminal 2 is connected to a terminal accommodating region 41B of positioning plate 41. The semiconductor elements 36, 37 connected to the film carrier 38 are put into an element accommodating region 41A, and the connection region 39A of the film carrier 38 is connected to the external connection terminal 2. This connection is easily achieved by thermal compression. The external connection terminal 2 may be fixed to the positioning plate 41 by applying an adhesive the same as in the first preferred embodiment and second preferred embodiment.

Since the semiconductor elements 36, 37 have already been connected to the wiring conductor 39 of the film carrier 38, it is not necessary to connect to the positioning plate 41. However, when an insulating resin material is injected at a later step, if the semiconductor elements 36, 37 may float, they may be fixed by an adhesive. In the same manner as in the first preferred embodiment or the second preferred embodiment, they may be attracted in vacuum. Since the semiconductor elements 36, 37 have already been connected to the film carrier 38 and fixed in position, the element accommodating region 41A for fitting them is not necessary.

Figure 9D:
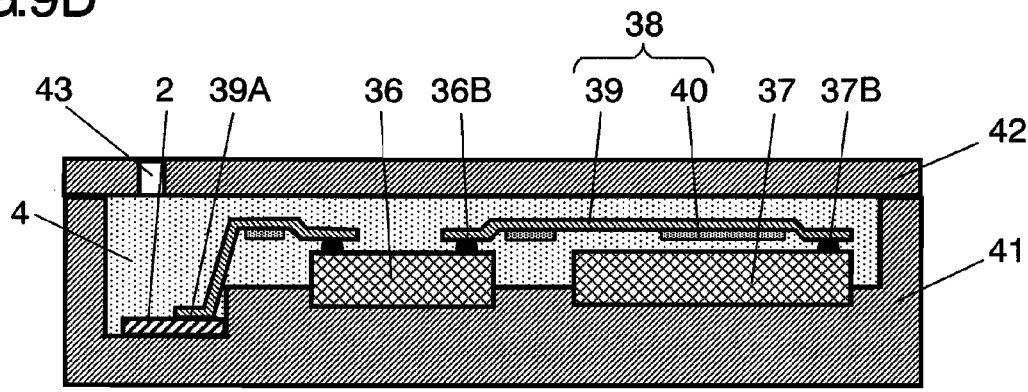
FIG. 9D is a sectional view explaining principal steps of the manufacturing method of the electronic circuit device in the third preferred embodiment of the present invention.
Figure 10:
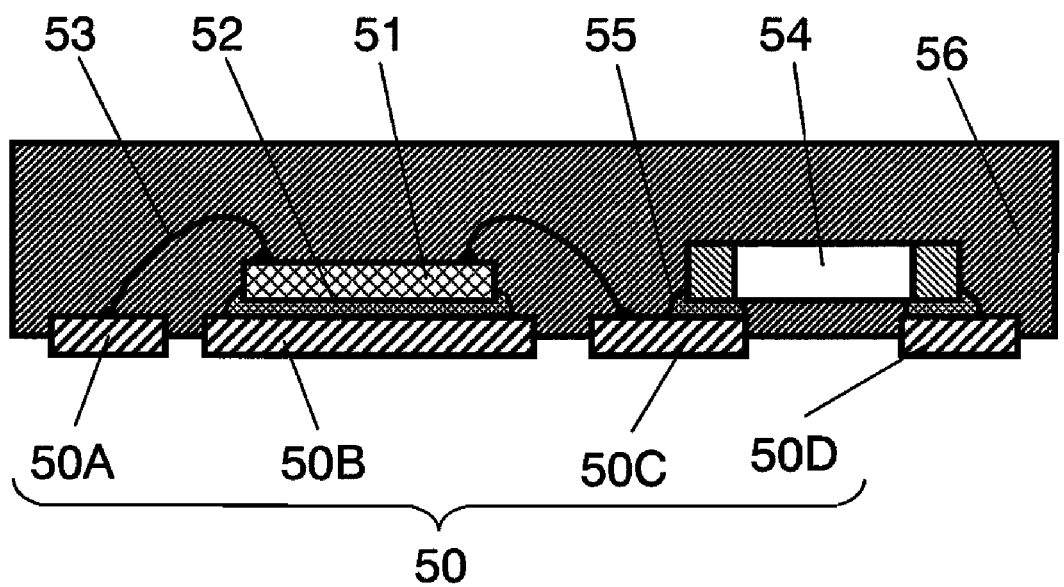
FIG. 10 is a sectional view of a conventional electronic circuit device using a support substrate such as a wiring substrate.
Figure 11:
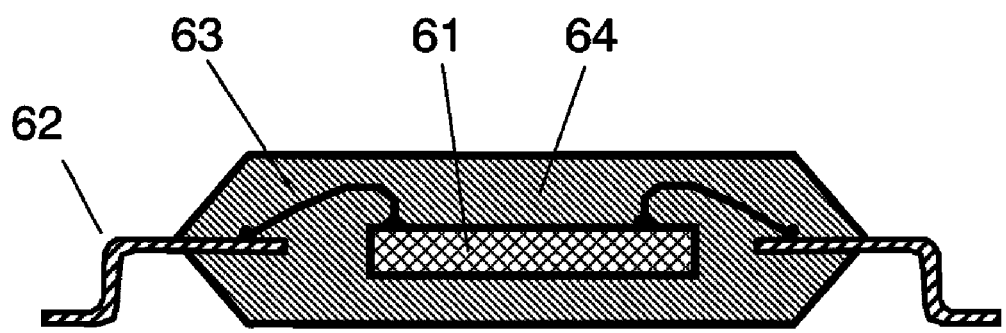
FIG. 11 is a sectional view of other example of the conventional electronic circuit device.

Further, as shown in FIG. 9D, the molding die 42 for resin molding and the positioning plate 41 are fitted. That is, in the manufacturing method of the present embodiment, too, the positioning plate 41 is used as one of the dies for resin molding. When the positioning plate 41 is used as one of the dies for resin molding, the semiconductor elements 36, 37 and the external connection terminal 2 can be directly molded with resin in mutually connected state.

After fitting the molding die 42 and positioning plate 41, an insulating resin material of low viscosity is poured from a resin flow inlet 43. The insulating resin material is poured and cured. As a result, a structure having one side molded with resin is obtained. In this state, the semiconductor elements 36, 37, part of external connection terminals 2, and film carrier 38 are entirely buried in the insulating resin 4, and fixed by the insulating resin 4. Therefore, when the structure is taken out, the relative positions are not changed, and connecting parts are not separated.

In the subsequent steps, the manufacturing method is the same as in the first preferred embodiment shown as later steps in FIG. 3B and FIG. 3C, and the process is explained by referring to the same drawings.

First, as shown in FIG. 3B, the structure having one side molded with resin is disposed on the lower die 9 so that the resin mold side is positioned under. The upper die 10 is fitted thereon. As a result, a space 12 is formed. The insulating resin material heated to be low in viscosity is poured into this space 12 from the resin flow inlet 11. The insulating resin material is poured, and then cured. The insulating resin material to be poured at this time is preferably the same as the insulating resin material as used in the steps illustrated in FIG. 9D. As a result, after cooling, the semiconductor elements 36, 37, film carrier 38, and part of the external connection terminal 2 are sealed with one type of insulating resin material, and a structure is formed. Afterwards, by removing the lower die 9 and the upper die 10, the electronic circuit device 35 shown in FIG. 8A and FIG. 8B is obtained.

In the electronic circuit device 35 of the preferred embodiment, since the wiring conductor 39, that is, the connecting conductor is supported by the insulating sheet 40, the pattern can be held constantly. As required, a dummy connecting conductor may be provided for supporting the insulating sheet 40. As shown in the pattern of wiring conductor 39 in FIG. 8B, an intermediate branched pattern may be processed easily, so that a wiring conductor 39 having a more complicated pattern can be formed. Accordingly, even when many semiconductor elements and passive components are disposed, they can be mutually connected easily. Therefore, warping can be extremely suppressed in spite of the fact that the device is thin, and an electronic circuit device of high function can be manufactured, such as an SD memory card or other memory card.

In the preferred embodiment, a film carrier is used as a connecting conductor; however, any wiring conductor having a part supported by an insulating sheet may be used. For example, a polyethylene terephthalate (PET) film is used as an insulating sheet, and a wiring conductor may be formed at its surface by using vapor deposition, plating, or copper foil.

In the first to third preferred embodiments, the same insulating resin is used in the first resin molding step and the second resin molding step; however, the present invention is not limited to this example. Different materials may be used.

The electronic circuit device of the present invention is particularly useful in the field of a card type electronic circuit device such as a memory card because the structure is thin and is extremely low in warping by connecting a semiconductor element or a semiconductor element and a passive component by a connecting conductor only, and burying them in an insulating resin.

The invention claimed is:

1. A manufacturing method of an electronic circuit device, comprising:
    setting a positioning plate having an element accommodating region for accommodating a semiconductor element, and a terminal accommodating region formed in a deeper step than the element accommodating region, for accommodating a plurality of external connection terminals;
    arranging the semiconductor element in the element accommodating region in a direction for exposing electrode pads of the semiconductor element, and arranging the external connection terminals in the terminal accommodating region;
    connecting the semiconductor element and the external connection terminals electrically by connecting conductors;
    a first resin molding step of covering and molding the connecting conductors, the semiconductor element and exposed sides of the external connection terminals with an insulating resin; and
    a second resin molding step of covering and molding regions of the external connection terminals contacting with the terminal accommodating region except for their terminal surfaces, and a region excluding a surface of the semiconductor element contacting with the element accommodating region, with an insulating resin, burying the semiconductor element in the insulating resin, integrating the semiconductor element and the external connection terminals, and exposing the terminal surfaces.

2. The manufacturing method of the electronic circuit device of claim 1,
    wherein the setting a positioning plate further includes forming a component accommodating region shallower than the terminal accommodating region in the positioning plate,
    the arranging the semiconductor element further includes disposing a passive component in the component accommodating region,
    the connecting the semiconductor element further includes connecting the passive component to the semiconductor element and at least one of the external connection terminals by the connecting conductors, and
    the first resin molding step and the second resin molding step further include burying the passive component, as well as the semiconductor element, into the insulating resin.

3. The manufacturing method of the electronic circuit device of claim 1,
    wherein the positioning plate is used as a lower in at the first resin molding step.

4. The manufacturing method of the electronic circuit device of claim 1,
    wherein thin metal wires are used as the connecting conductors.

5. The manufacturing method of the electronic circuit device of claim 1,
    wherein as each of the connecting conductors, a wiring conductor having a wiring pattern for connecting to the semiconductor element and a connection region for connecting to one of the external connection terminals is supported by an insulating sheet.

6. The manufacturing method of the electronic circuit device of claim 1,
    wherein in the arranging the semiconductor element, a first semiconductor element in the element accommodating region and one or more second semiconductor elements in a region enclosed by electrode pads of the first semiconductor element are accumulated and disposed.

* * * * *